(12) United States Patent
Tanielian

(10) Patent No.: US 6,771,007 B2
(45) Date of Patent: Aug. 3, 2004

(54) VIBRATION INDUCED PERPETUAL ENERGY RESOURCE

(75) Inventor: Minas H. Tanielian, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/124,049

(22) Filed: Apr. 17, 2002

(65) Prior Publication Data

US 2003/0197448 A1 Oct. 23, 2003

(51) Int. Cl.[7] .................................................. H01L 41/08
(52) U.S. Cl. .................. 310/339; 310/329; 310/331
(58) Field of Search ................................ 310/330, 332, 310/329

(56) References Cited

U.S. PATENT DOCUMENTS

| | | | |
|---|---|---|---|
| 3,456,134 A | | 7/1969 | Ko |
| 3,466,473 A | | 9/1969 | Rhoten |
| 3,553,588 A | | 1/1971 | Honig |
| 3,624,451 A | | 11/1971 | Gauld et al. |
| 4,467,236 A | * | 8/1984 | Kolm et al. ................. 310/321 |
| 4,510,484 A | | 4/1985 | Snyder |
| 5,463,374 A | | 10/1995 | Mendez et al. |
| 5,751,091 A | | 5/1998 | Takahashi et al. |
| 5,801,475 A | * | 9/1998 | Kimura ....................... 310/319 |
| 6,306,773 B1 | | 10/2001 | Adas et al. |
| 6,382,026 B1 | * | 5/2002 | Tajika et al. ............. 73/514.34 |
| 6,407,484 B1 | | 6/2002 | Oliver et al. |
| 6,530,276 B2 | * | 3/2003 | Tajika et al. ............. 73/514.34 |

FOREIGN PATENT DOCUMENTS

| | | |
|---|---|---|
| GB | 2 026 284 | 7/1979 |
| GB | 2 064 883 | 11/1980 |

OTHER PUBLICATIONS

John Kymissis, Clyde Kendall, Joseph Paradiso, Neil Gershenfeld, "Parasitic Power Harvesting in Shoes", Aug. 1998, p. 1–8.

Ibong Jung and Yongrae Roh, Design and fabrication of piezoceramic bimorph vibration sensors, Sensors and Actuators A 69 (1998) 259–266.

F. J. von Preissig and E.S.Kim, Topics in Finite–Element Modeling of Piezoelectric MEMS.

Meteer, Jami, Front–Side Processing of a Piezoelectric MEMS Accelerometer, The Pennsylvania State University National Nanofabrication Users Network, pp. 48–49.

Kloeppel, James E., Residual stress in piezoelectric ceramics can be reduced, put to work, News Bureau, (Sep. 1, 2000).

* cited by examiner

Primary Examiner—Mark Budd
(74) Attorney, Agent, or Firm—Harness Dickey & Pierce P.L.C.

(57) ABSTRACT

A piezoelectric device connected to a vibration source converts vibration energy to electrical current. A plurality of pairs of oppositely polarized piezoelectric wafers deflect to produce an electrical current. Each pair of wafers are arranged back-to-back and electrically joined together. The plurality of pairs of wafers are each connected to a set of micro-machined parts. Each pair of wafers form a bimorph, configured as a cantilevered beam attached to a set of parts to form an element. Each cantilevered beam has a mass weighted first end and is fixedly attached to one or more flexible sheaths on a second end. A plurality of elements form a cell unit. A plurality of cell units form an array. The electrical current produced varies by the number of elements per cell unit, and/or with the number of cell units per array.

16 Claims, 17 Drawing Sheets

VIBRATION INDUCED PERPETUAL ENERGY RESOURCE

FIELD OF THE INVENTION

The present invention relates generally to piezoelectric devices which generate electrical energy by induced vibration and more specifically to an apparatus and method to utilize a thin, conformable sheet, having a plurality of piezobimorph cantilevered beams to produce electrical energy.

BACKGROUND OF THE INVENTION

Moving objects or platforms generate vibration energy which is commonly steady in amplitude or that increases with age of the object or platform. All platforms suffer material degradation over time due to this continuous vibration, and for this reason system inspections are periodically performed or sensors are installed to monitor strain levels in such structures to help predict material failure. Common remotely addressable sensor devices require a power level in the milliwatt (mW) range. Batteries or other fuel sources can power such sensing devices. These power sources have drawbacks in that they require frequent maintenance or replacement, and in many instances may be located in difficult to reach locations in a platform. In addition, they deliver inadequate power levels and often fail at low temperature extremes.

Devices which generate mechanical or electrical power by the vibration of the item to which they are attached are known. In an exemplary application, the proof mass used in automatic wrist watches, i.e., the self-winding wrist watches, either rotates or moves in one direction due to the movement of the wearer's wrist. This type of device produces energy in very low quantities, typically in the microwatt range, sufficient to power the wrist watch. Based on its low power output and form factor, this type of device is not desirable for a power source for remote sensing devices required on applications for moving platforms such as aircraft. Further, this type of proof mass system is more suitable for impulse movements as opposed to continuous vibration movements. In addition, a further drawback of the proof mass type system of power generation is the size of the proof mass is typically impractical for use on most embedded sensor Materials which can be attached to a vibration source and which generate an electrical current from the vibrations are known. Piezoelectric materials are examples of these materials, and are well known in the art. These materials generate small electrical currents when the material is deflected, for example by vibrations. A piezoelectric device which is small in size and advantageously utilizes the vibration energy of the platform as a power source is desirable. The use of very small devices such as micro-electro-mechanical systems (MEMS) is known in the art to generate power. However, they are either impractical due to the low power generated (i.e., typically in the microwatt range or as low as the nanowatt range) or unreliable compared with piezoelectric devices.

Piezoelectric crystal systems harvesting energy from the motion of humans or animals are also known. This type of a device is disclosed in U.S. Pat. No. 3,456,134 issued to Kuo. Although the energy harvested by such a device may be adequate for remote sensing applications, it is macroscopic in size, measured in inches, which is undesirable for most embedded sensing systems.

The improvement using a piezoelectric bimorph beam to harvest vibration energy is also known. A bimorph beam is herein defined as a mirror image double layer of piezoelectric material arranged in beam formation. A bimorph beam is created by joining two oppositely polarized piezoelectric materials in a face-to-face configuration such that deflecting or bending the bimorph structure in one direction creates an electrical potential, and bending the structure in the opposite direction creates an equivalent electrical potential. The bimorph structure therefore produces electric current when deflected in either of two directions. However, most known bimorph piezoelectric beam configurations to date have been on larger size beam configurations, and thus cannot be deployed in a thin conformal layer that can be attached to an arbitrarily shaped structure without adding significant weight or volume.

An improvement is therefore desirable for piezoelectric material bimorph systems such that the resulting configuration is able to produce reasonably high current levels, while at the same time can provide a piezoelectric bimorph beam system which provides a degree of flexibility or conformability such that the material can be applied over a variety of surface areas, i.e. flat as well as curving surface areas. Also, past implementation of piezoelectric beams either have not had adequate protection so that the beam does not break or get damaged over a very long time period (tens of years) in a very harsh environment (e.g., aerospace) or they have had rather bulky and impractical protective packages.

SUMMARY OF THE INVENTION

According to the principles of the present invention, large arrays of MEMS devices having weighted, cantilevered, piezoelectric beams in a bimorph configuration, oscillate and produce electrical current from vibrations of the surface to which they are attached. The piezoelectric power source of the present invention can be integrated in a variety of applications, including wireless sensor modules. The power devices of the present invention are capable of operation as part of a stand-alone unit that can last for the lifetime of a system, a time span measured in decades. The magnitude of energy needed for exemplary wireless sensor applications require a generation rate of milliwatts of power. This is achieved in the present invention by maximizing the amount of energy each MEMS element generates and by using a large array of elements.

The power source devices of the present invention are made of the following parts: (1) an element—a weighted, cantilevered MEMS piezoelectric bimorph beam; (2) a unit cell—a collection of MEMS elements in a form of about 1 centimeter squared ($cm^2$) in area and about 0.5 millimeters (mm) thick, having about 150 to about 200 elements; (3) an array—the collection of many unit cells, typically about 100, all interconnected electrically to form a power generation unit; and (4) a protective sheath—a partially flexible electrically conductive material which forms a protective envelope for the unit cells on at least one element side and which provides the interconnection pathways between each element and the array. The sheath in one embodiment also provides a boundary limit, so that each piezobimorph element beam cannot overextend under impulse conditions, which could result in fracture. The sheath is preferably perforated, but can also be totally solid for some applications. The sheath is preferably flexible to permit an array to be connected over a flat or a contoured surface. The use of the sheath also allows for the array of MEMS piezoelectric bimorph beams to couple to longer wavelength harmonic vibrations of the structure, in a collective mode pattern, due to the fact that all the elements of the array are mechanically joined to the sheath on one end.

In one preferred embodiment of the present invention, a bimorph piezoelectric device is provided, comprising a plurality of micro-electro-mechanical-system (MEMS) piezoelectric beams. The plurality of MEMS beams is arranged as pairs of MEMS beams, each pair having a connecting end and a weighted end. Each of said pairs of MEMS beams is electrically and mechanically joined through its connecting end to at least one flexible electrically conductive sheath, to form a joined array of MEMS beams, each having its weighted end free to deflect. Each weighted end of said pairs of MEMS beams of said joined array is deflectable to produce an electric current proportional to a quantity of said pairs of MEMS beams, said electric current is collectable from each of said at least one electrically conductive sheath.

In another preferred embodiment of the present invention, a piezoelectric device for converting vibration energy to electric current is provided, comprising a plurality of pairs of oppositely polarized piezoelectric wafers deflectable to produce an electrical current. The plurality of pairs of wafers are each connected to a set of micro-machined elements. Each said set of elements with said pairs of wafers form a bimorph, said bimorph being configured as a cantilevered beam. Each said cantilevered beam is mass weighted on a first beam end, and fixedly attached to at least one protective sheath on a second beam end. A plurality of said bimorphs on said at least one protective sheath form an array.

In yet another preferred embodiment of the present invention, a method for forming a horizontally configured piezoelectric electrical current generating device is provided, which comprises the steps of: (I) creating an initial sub-assembly by: (1) joining a piezoelectric material plate to an upper surface of a substrate; (2) micromachining a lower surface of said substrate to both form a plurality of masses supported by said piezoelectric material plates and retain a plurality of non-machined lower surface areas; (3) electrically bonding said plurality of non-machined lower surface areas to an electrically conductive protective sheath; and (4) cutting through said piezoelectric material to separate a plurality of individual cantilevered piezoelectric material beam lengths; and (II) constructing a mirror-image sub-assembly to said initial sub-assembly; and (III) connecting said mirror image sub-assembly to said initial sub-assembly.

In still another preferred embodiment of the invention, a method for forming a vertically configured piezoelectric electrical current generating device is provided, which comprises the steps of: (1) filling until dry a sacrificial plastic replica mold with a ceramic piezoelectric slurry to form a piezoceramic green body; (2) bonding a substrate to said piezoceramic green body; (3) heat curing the substrate and piezoceramic green body to both remove said plastic mold and expose a plurality of piezoceramic vertical beams; (4) casting a resist over said beams along a top surface thereof; (5) aligning an X-ray exposure to create a plurality of recesses for an electrode structure and plating a metal in the recesses to metallize the piezoelectric beams; (6) flood exposing a remaining portion of said vertical beams; (7) spin-coating a thin negative resist layer for electrical isolation between the piezoelectric beams and the metallic proof mass and spin-coating a metal filled, negative X-ray resist on the top surface to provide a cantilevered proof mass; (8) performing a second aligned X-ray exposure to separate said cantilevered mass into a plurality of cantilevered masses; and (9) stripping both a remaining portion of said negative resist and said flood exposed resist to form a plurality of said cantilevered piezoceramic vertical beams, each having one of said plurality of cantilevered masses.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
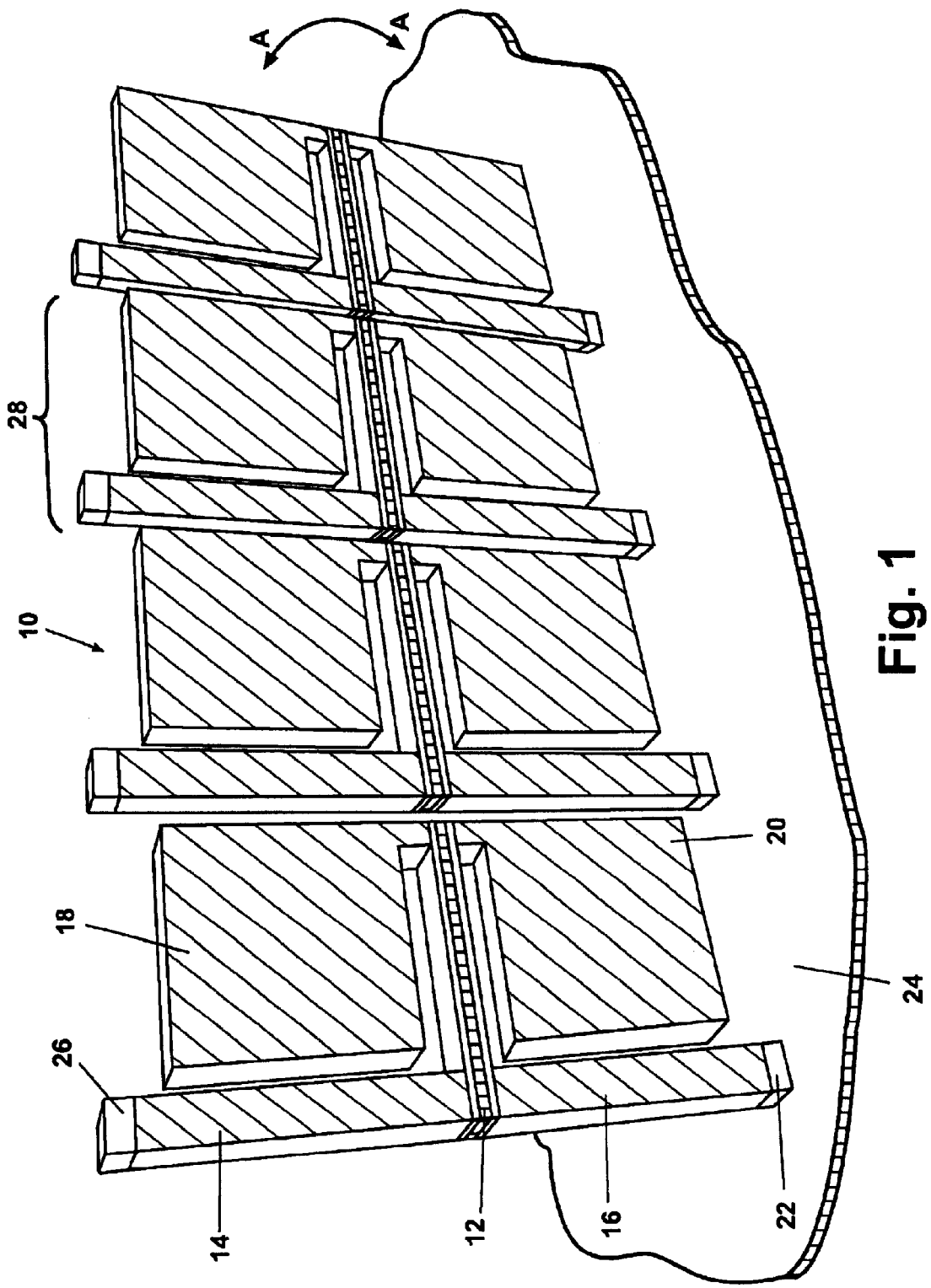
FIG. 1 is a perspective view of a partial unit cell of MEMS piezoelectric cantilevered weighted beams of the present invention.

Referring to FIG. 1, a MEMS partial unit cell 10 is shown. Partial unit cell 10 comprises a plurality of piezoelectric cantilevered beams 12. At a fixed or support end of each of the piezoelectric cantilevered beams 12, an intermediate upper column 14 and an intermediate lower column 16 are provided. At a distal end of each piezoelectric cantilevered beam 12, an upper cantilevered mass 18 and a lower cantilevered mass 20 are provided. The upper and lower cantilevered masses 18 and 20, respectively, are provided to lower the resonant mode of the relatively short and stiff piezoelectric cantilevered beam 12.

When attached to a vibrating structure or item, the partial unit cell 10 will vibrate in response to the vibration source. The upper cantilevered mass 18 and the lower cantilevered mass 20 will deflect in the mass direction of motion arrows A as shown. For a horizontal element configuration shown in FIG. 1, each of the intermediate columns 14 and 16, respectively, are attached to a flexible, electrically conductive sheath. In the configuration shown, the intermediate lower column 16 is attached to a lower sheath 24 by electrically conductive adhesive 22. Similarly, the intermediate upper column 14 is supported to an upper sheath (not shown) by the electrically conductive adhesive 26. Current generated by any of the individual piezoelectric cantilevered beams 12 is transferred via each intermediate upper column 14 and the intermediate lower column 16 to either the lower sheath 24 or the upper sheath (not shown). A plurality of MEMS elements 28 will make up a cell unit.

Figure 2:
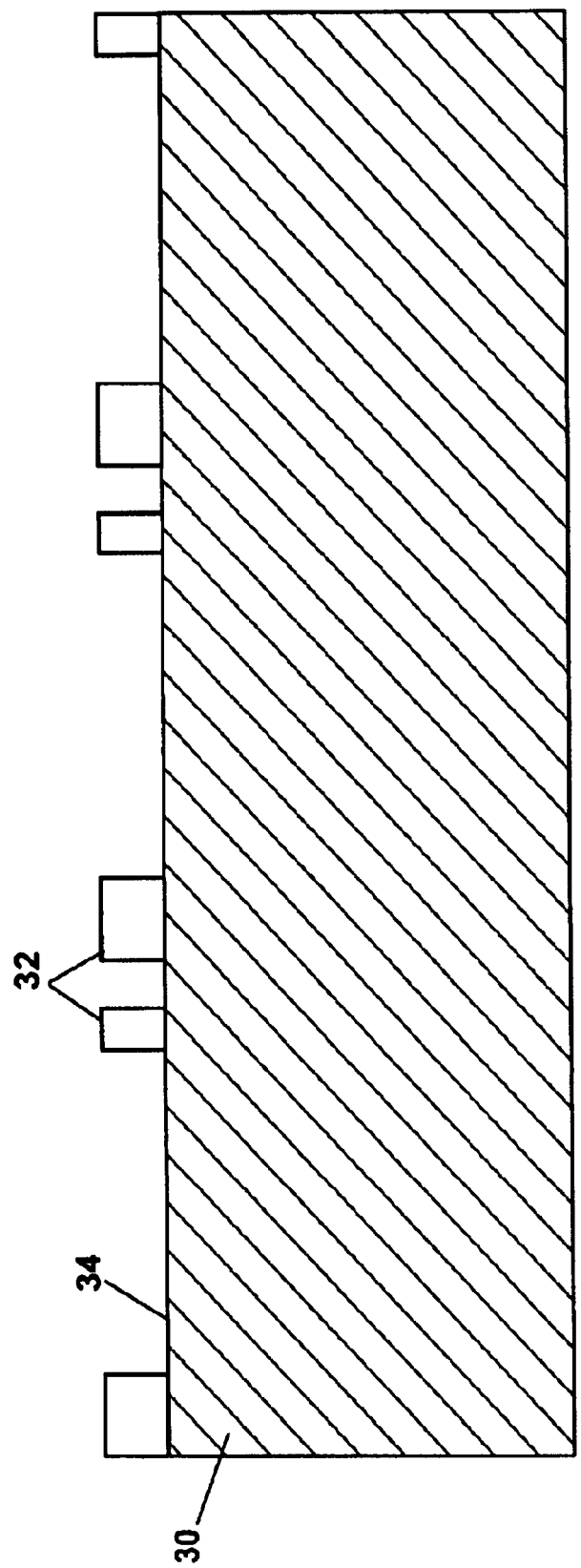
FIG. 2 is an elevation view of an exemplary substrate block at the initial step of manufacture of the partial unit cell.

Referring now to FIG. 2, a substrate 30 from which an individual group of MEMS elements 28 are formed is shown in the initial stage of construction. The substrate 30 is preferably made from one of the refractory metals such as tungsten, molybdenum, tantalum, or titanium. At this initial step, the substrate 30 is provided with a photo-resist masking pattern 32 which is subsequently used in a photolithography process to trench the substrate upper surface 34. The photo-resist masking pattern 32 is attached as known in the art and will not be discussed further herein.

Figure 3:
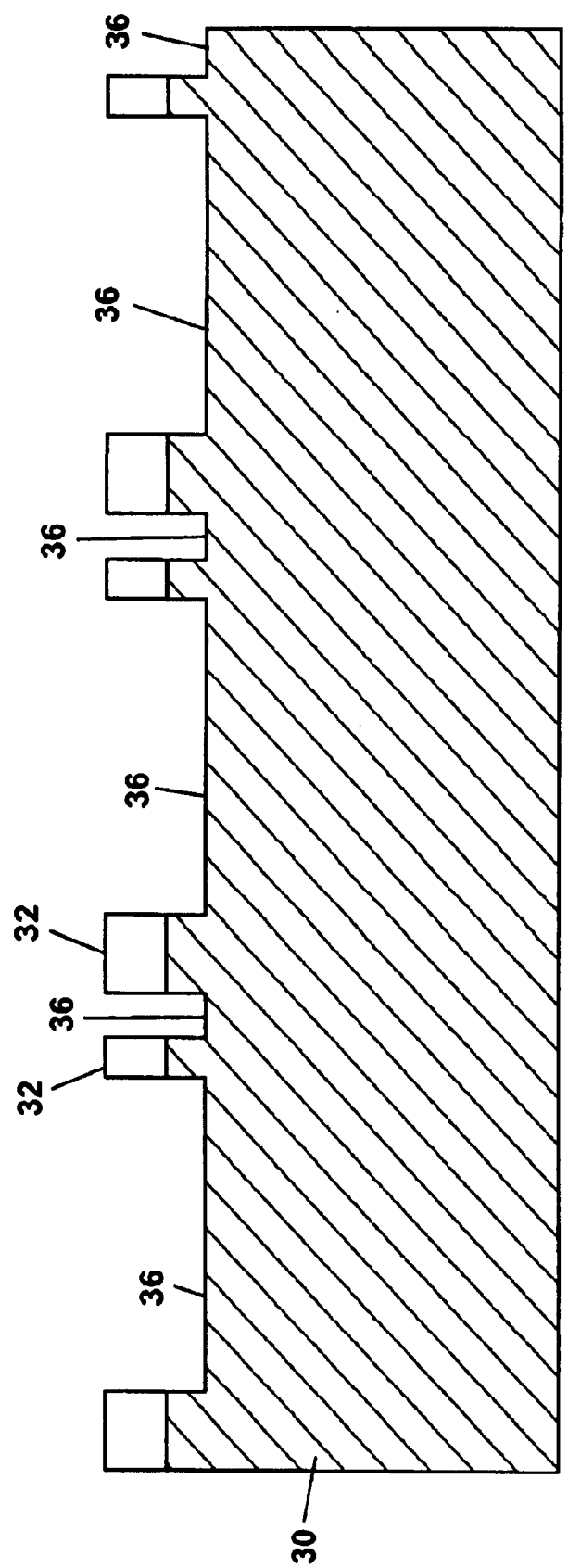
FIG. 3 is the elevation view of FIG. 2, further showing a first etching step producing trenches in the substrate.

Referring to FIG. 3, a plurality of individual trenches 36 is shown, which are etched in the substrate 30 by a photolithography process. The photo-resist masking pattern 32 provides the outer boundaries of each trench 36.

Figure 4:
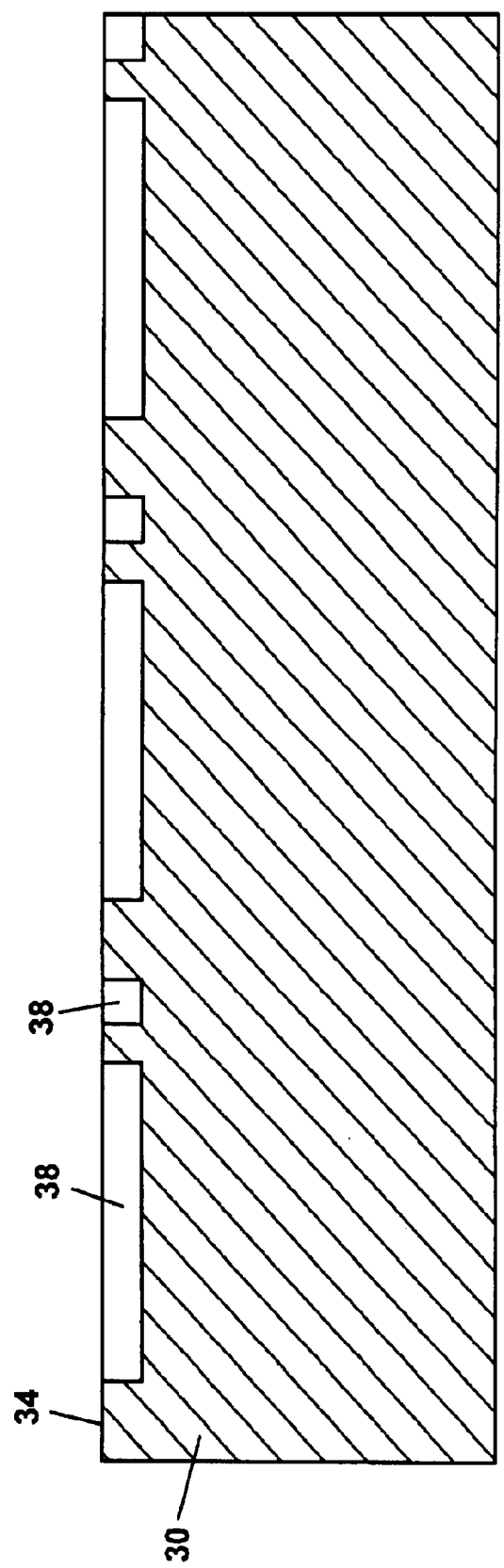
FIG. 4 is the elevation view of FIG. 3, further showing removal of a masking material and depositing a sacrificial material in the trenches.

Referring to FIG. 4, the photo-resist masking pattern 32 from FIG. 3 is removed and a sacrificial material 38 is filled into each of the previously etched trenches 36. The sacrificial material 38 is filled up to the level of the substrate upper surface 34 of substrate 30 as shown. The sacrificial material 38 is typically an aluminum material but may comprise other metals or other materials as desired.

Figure 5:
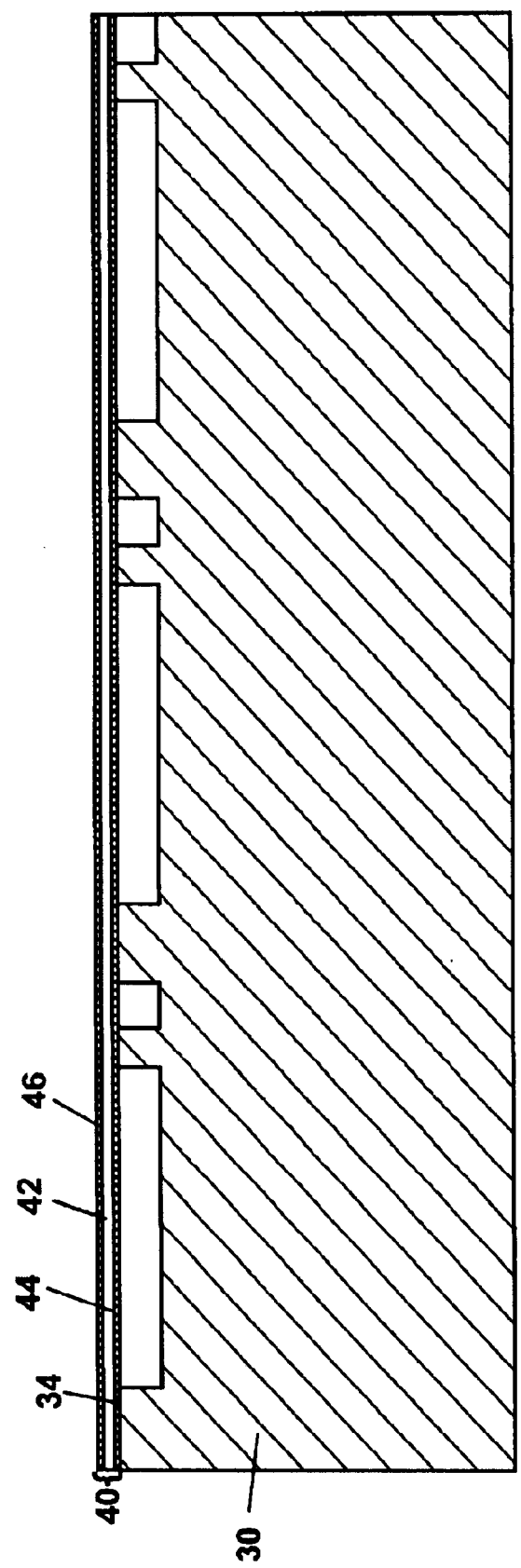
FIG. 5 is the elevation view of FIG. 4, further showing attachment of a piezoelectric layer metallized on both sides adjacent to the filled trenches.

Referring now to FIG. 5, following addition of the sacrificial material 38, a piezoelectric wafer 40 is attached to substrate 30 at the substrate upper surface 34. The piezoelectric wafer 40 is attached to the substrate 30 following a suitable metallization deposit (not shown) between the substrate upper surface 34 and the piezoelectric wafer 40 as known in the art.

The piezoelectric wafer 40 comprises a central layer of a piezoelectric material 42 surrounded by individual layers of metallization film including a lower metallization film 44 and an upper metallization film 46. The piezoelectric material 42 preferably is a piezoelectric material with a high coupling factor, such as lead-magnesium-niobium-titanate (PMNT). The lower metallization film 44 and the upper metallization film 46 are preferably comprised of an electrically conductive solder-type material. By heating the metallization deposit on the substrate upper surface 34 and the lower metallization film 44 of the piezoelectric wafer 40, the connection between the piezoelectric wafer 40 and the substrate 30 is made. The lower metallization film 44 can also be a conductive epoxy.

Prior to applying metallization layers on the piezoelectric material 42, the piezoelectric material 42 is first poled. Poling is a process known in the art which applies a very high value electric field together with elevated temperature to align the molecules in a single direction in the piezoelectric material 42. Poling is preferably performed prior to bonding the piezoelectric material 42 because the poling process requires the addition of heat (approximately 600° C. for ceramic piezoelectrics) which is undesirable after the piezoelectric wafer 40 is formed. Subsequent deflection of piezoelectric material 42 creates a positive-to-negative charge separation distance which creates a voltage or potential between any two points of the material. This voltage is extracted as current by connecting the material through a resistor or electrical load device. The voltage and therefore the current produced is proportional to the amount of pressure bending applied to the piezoelectric material 42.

Figure 6:
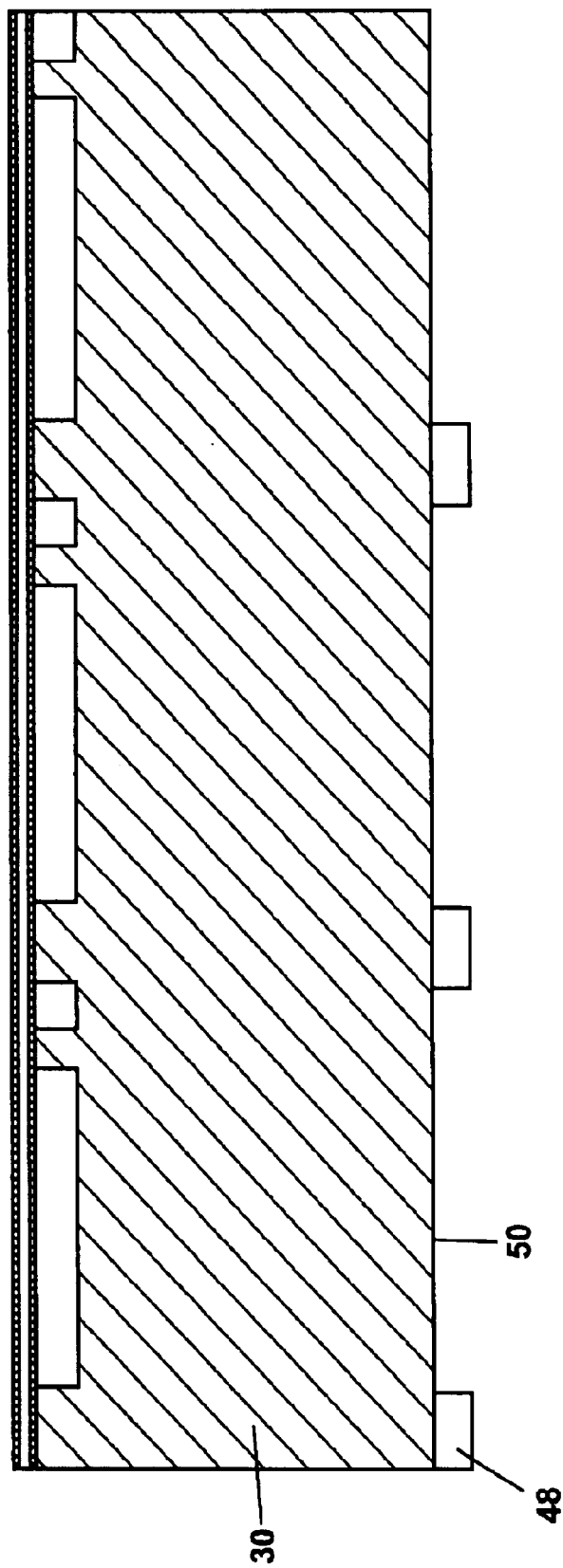
FIG. 6 is the elevation view of FIG. 5, further showing application of a masking layer on a lower substrate face.

Referring now to FIG. 6, a further photolithographic process is performed by first applying a photo-resist masking pattern 48 on a substrate lower surface 50 of the substrate 30. Similar to the process of FIG. 2, the process initiated in the step shown by FIG. 6 is used to etch trenches (see FIG. 7) in each of the sections between the raised features of the masking pattern 48.

Figure 7:
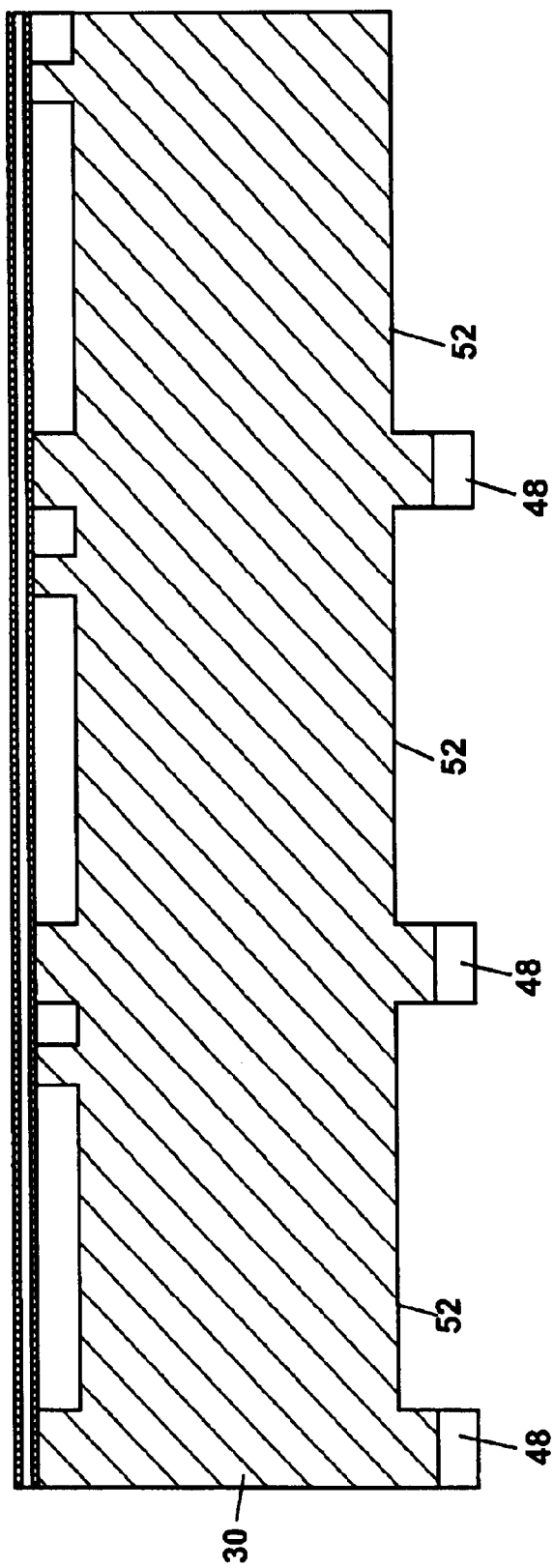
FIG. 7 is the elevation view of FIG. 6, further showing etching of the lower substrate face and formation of lower channels.

Referring now to FIG. 7, a plurality of trenches 52 is shown following etching between the raised features of the photo-resist masking pattern 48 attached to the substrate 30.

Figure 8:
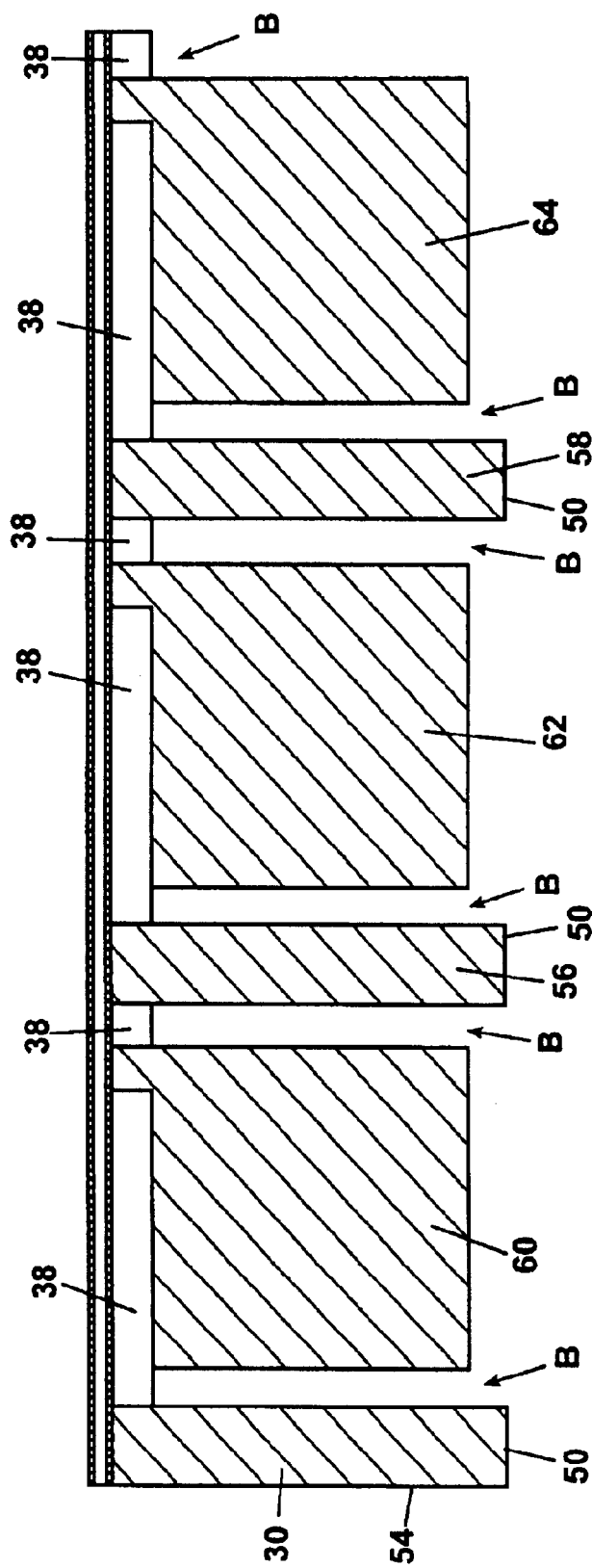
FIG. 8 is the elevation view of FIG. 7, further showing micro-machined channels from the lower substrate face to a depth of the sacrificial

Referring now to FIG. 8, each portion of the photo-resist masking pattern 48 shown in FIG. 7 is removed to expose the substrate lower surface 50. A micromachining process is performed in each of the micro-machined areas designated with arrow B to remove material to a depth of, but not including the areas of the sacrificial material 38. By removing material in the micro-machined areas B, individual intermediate columns are formed. A first intermediate column 54, a second intermediate column 56 and a third intermediate column 58 are formed by this micro-machining process. In addition to the intermediate columns 54, 56, and 58, respectively, a group of weighted masses is also formed. A first weighted mass 60, a second weighted mass 62 and a third weighted mass 64 are shown. For clarity, FIG. 8 shows only three exemplary intermediate columns and three exemplary weighted masses, however a plurality of such columns and masses are constructed to form a unit cell. Each of the intermediate columns 54, 56, and 58, as well as each of the weighted masses 60, 62 and 64 are comprised of the material of the substrate 30. The sacrificial material 38 is retained in the step shown in FIG. 8 to protectively support each of the structures shown prior to completion of the attachment and micro-machining processes.

Figure 9:
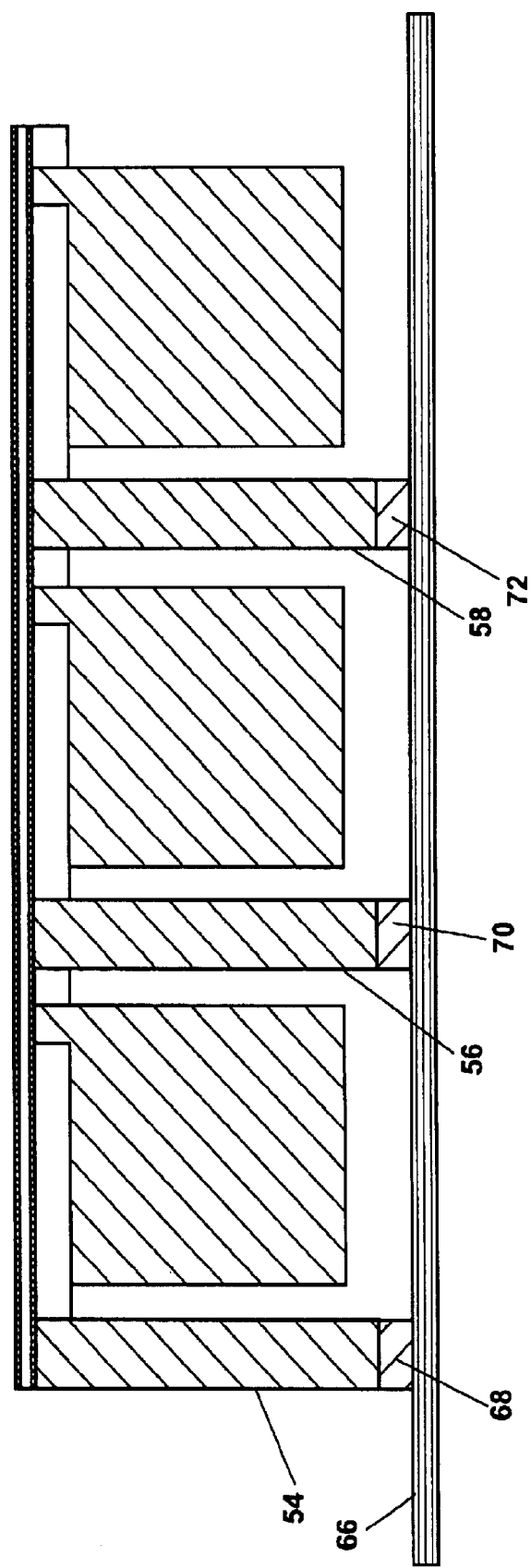
FIG. 9 is the elevation view of FIG. 8, further showing attachment of a flexible sheath having electrically conductive traces disposed on FIG. 10 is the elevation view of FIG. 9, further showing multiple cuts through the piezoelectric beam layer.

Referring now to FIG. 9, the resulting structure shown in FIG. 8 is attached to a conductive sheath 66 at distal ends of each of the intermediate columns. The first intermediate column 54 is joined to the conductive sheath 66 via a first conductive adhesive area 68. The second intermediate column 56 is joined to the conductive sheath 58 via a second conductive adhesive area 70. The third intermediate column 58 is joined to the conductive sheath 66 via a third conductive adhesive area 72. The conductive adhesive used to join the intermediate columns to the conductive sheath 66 is preferably an electrically conductive epoxy material, which is selected to provide sufficient stiffness to transfer the vibration energy of the vibration source (not shown) through the conductive sheath 66 to each intermediate column with low energy loss and small frequency change.

Figure 10:
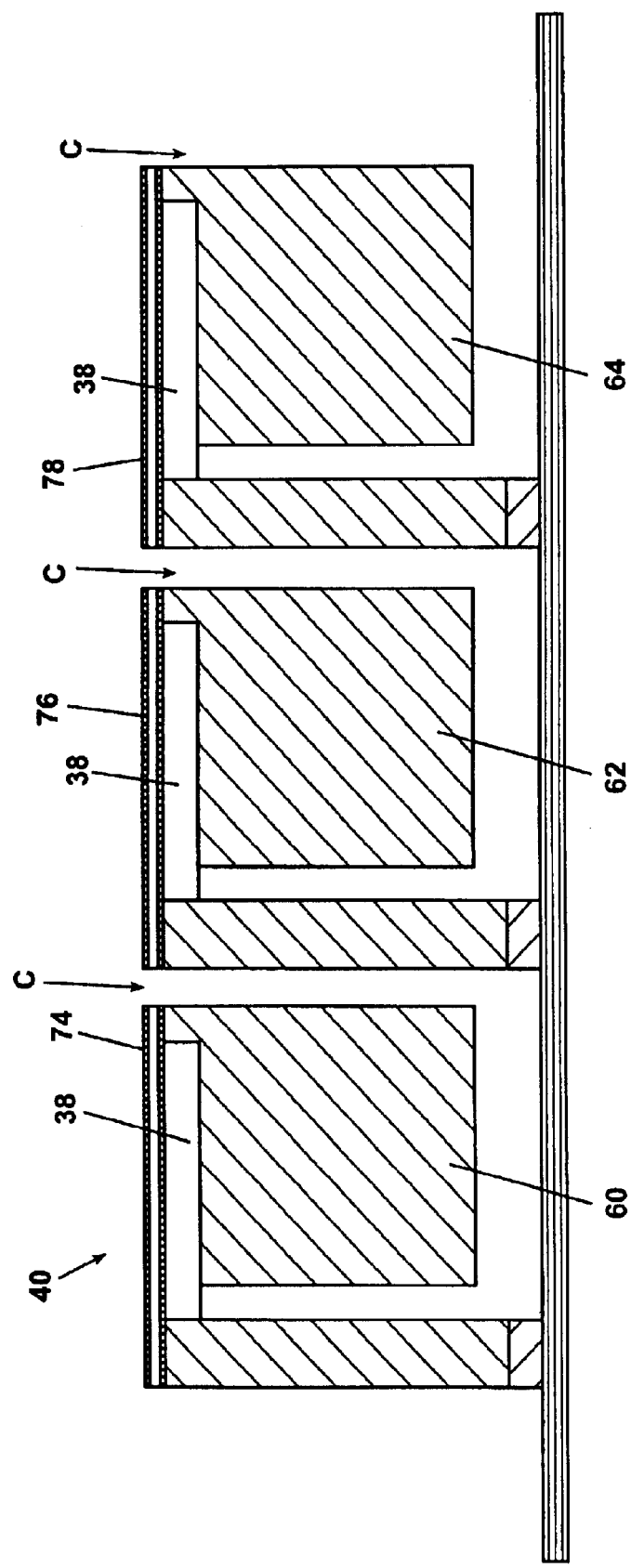

Referring to FIG. 10, a micro-machining step is next performed. Micro-machined (cut) areas identified by arrows C are shown between each successive weighted mass and its adjacent intermediate column. The portion of the sacrificial material 38 which is immediately below the section of the piezoelectric wafer 40 prior to this step (see FIG. 9) is also removed by this micro-machining process. Each micro-machining cut is preferably performed using either a laser machining or a semi-conductor wafer saw process to separate the piezoelectric wafer 40 into individual cantilevered beams. A first cantilevered beam 74, a second cantilevered beam 76 and a third cantilevered beam 78 are shown in FIG. 10 following the removal of material by the micro-machining process. Note that the sacrificial material 38 is retained in the step shown in FIG. 10 in order to retain the structural rigidity between each of the weighted masses 60, 62 and 64 and the underside of each of the cantilevered beams 74, 76 and 78 respectively. These layers of the sacrificial material 38 are removed in a later step.

Figure 11:
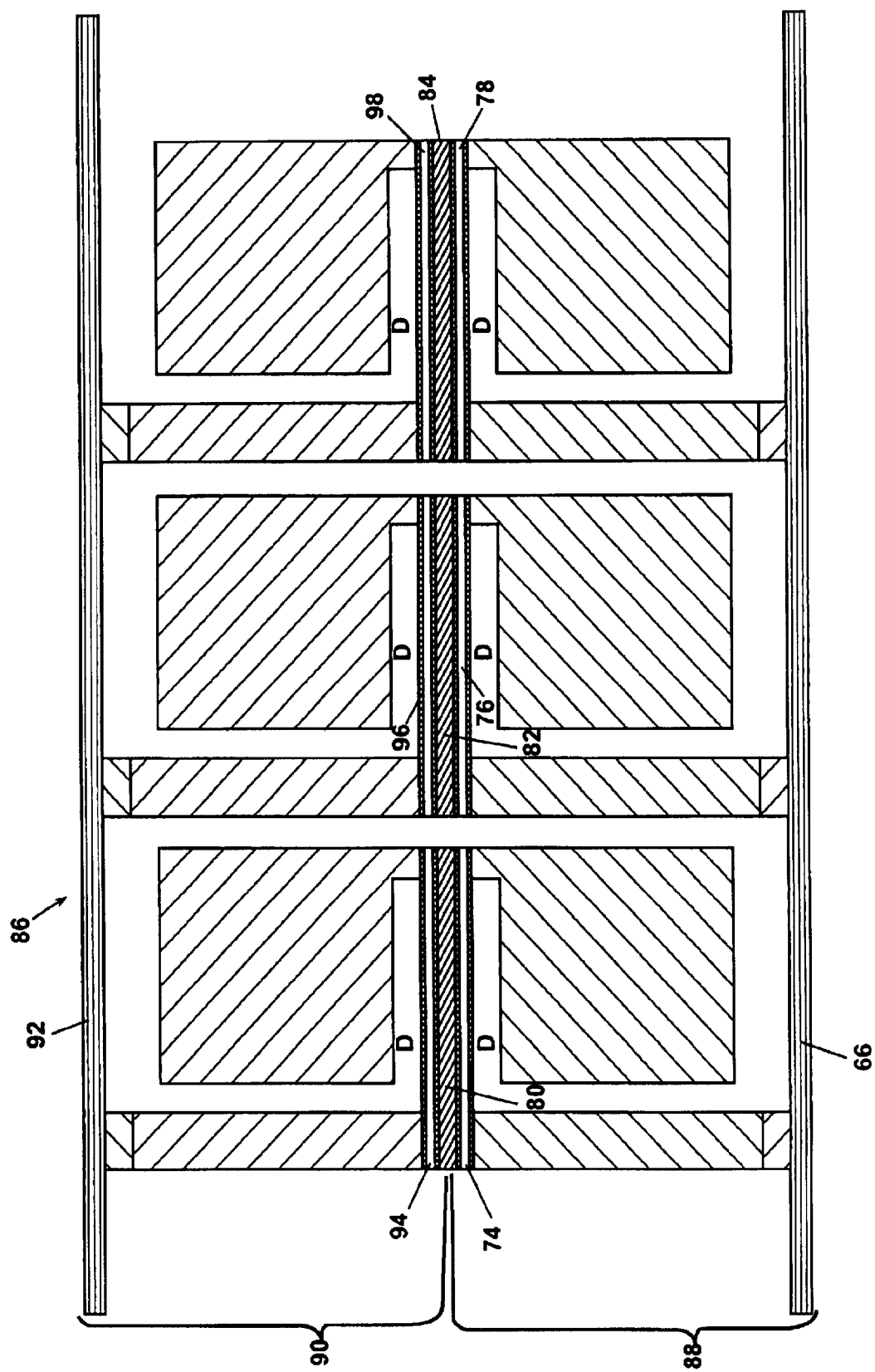
FIG. 11 is the elevation view of FIG. 10, further showing a mirror image element assembly attached at each outwardly exposed piezoelectric beam layer of the FIG. 10 initial assembly.

Referring now to FIG. 11, a partial unit cell 86 is shown. The partial unit cell 86 is constructed by using an initial sub-assembly 88 provided by the step of FIG. 10 and adding to this a mirror image sub-assembly 90 which is the mirror image of the initial sub-assembly 88 The mirror image sub-assembly 90 is constructed using the same techniques and steps as that for the initial sub-assembly 88 and is therefore not described in detail herein. As described below, conductive metallization layers (similar to those applied in the step described in FIG. 5) are shown in exaggerated thickness between each of the cantilevered beam pairs.

A conductive sheath 92 forms an upper surface for the partial unit cell 86, arid the conductive sheath 66 forms a lower surface for the partial unit cell 86. The initial sub-assembly 88 and the mirror image sub-assembly 90 are joined at the junction between cantilevered beams. As shown in FIG. 11, the first cantilevered beam 74 of the initial subassembly 88 is joined to a fourth cantilevered beam 94 through a first conductive metallization layer 80. The second cantilevered beam 76 is joined to a fifth cantilevered beam 96 through a second conductive metallization layer 82. The third cantilevered beam 78 is similarly joined to a sixth cantilevered beam 98 through a third conductive metallization layer 84. After alignment of each of the paired cantilevered beams, a heating process known in the art as solder-reflow is applied to physically join the initial sub-assembly 88 to the mirror image sub-assembly 90 via the conductive metallization layers 80, 82, and 84 respectively.

Following the step of joining each of the groups of cantilevered beams, the remaining sacrificial material 38 (previously retained in FIG. 10), is removed from each of the spaces adjacent to each cantilevered beam and its associated weighted mass, i.e., in the areas identified as material removal areas D. The sacrificial material 38 is removed by an etching process. An outer facing surface of either the conductive sheath 66 or the conductive sheath 92 can be joined to a vibrating structure or body (not shown) through the use of a suitable adhesive or other joining method. The partial unit cell 86 is flexible to allow the conductive sheath 66 or the conductive sheath 92 which is attached to the vibrating body to conform to either a generally flat or a moderating surface of the body.

Electrical current generated by any of the cantilevered beams is passed via its associated intermediate column through its connecting adhesive area to its associated conductive sheath. Electrical current is collected from both the conductive sheath 66 and the conductive sheath 92.

Figure 12:
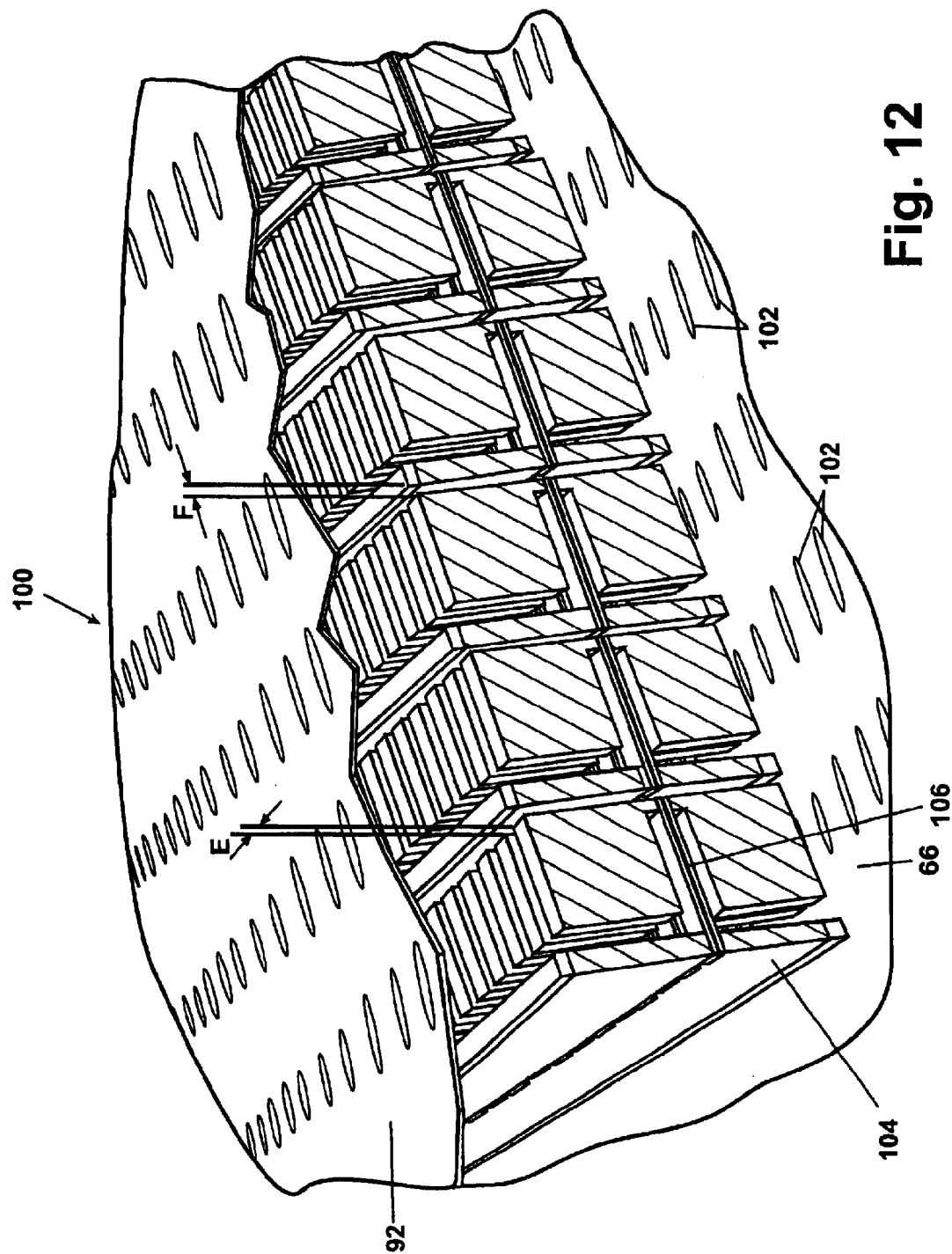
FIG. 12 is a perspective view of a partial unit cell of the present invention showing a perforated upper and lower sheath.

Referring to FIG. 12, a perspective, cut-away view of a unit cell 100 is shown. The conductive sheath 66 and the conductive sheath 92 of the unit cell 100 are also shown. A plurality of apertures 102 are formed in each of the conductive sheaths 66 and 92. The apertures 102 are optionally provided for an etching solution to remove the sacrificial material remaining on any portions of the unit cell 100. FIG. 12 also shows a continuous intermediate column 104 that is preferably used in place of individual intermediate columns (e.g., intermediate column 16 of FIG. 1) for a more efficient structural joining of a plurality of elements of the unit cell 100. A typical mass to mass spacing identified by arrows E is shown. The mass to mass spacing ranges from about several micrometers to about 100 micrometers. A typical mass to column spacing identified by arrows F is also shown. The typical mass to column spacing also ranges from about several micrometers to about 50 micrometers. Following element assembly as shown in FIG. 12, each of the joined pairs of cantilevered beams form a bimorph beam 106. The bimorph beam 106 construction provides a double layer of piezoelectric material. Each layer half has an oppositely polarized surface. By bending the bimorph beam 106 in either direction (as indicated by arrow A in FIG. 1), an electrical current is generated.

Figure 13:
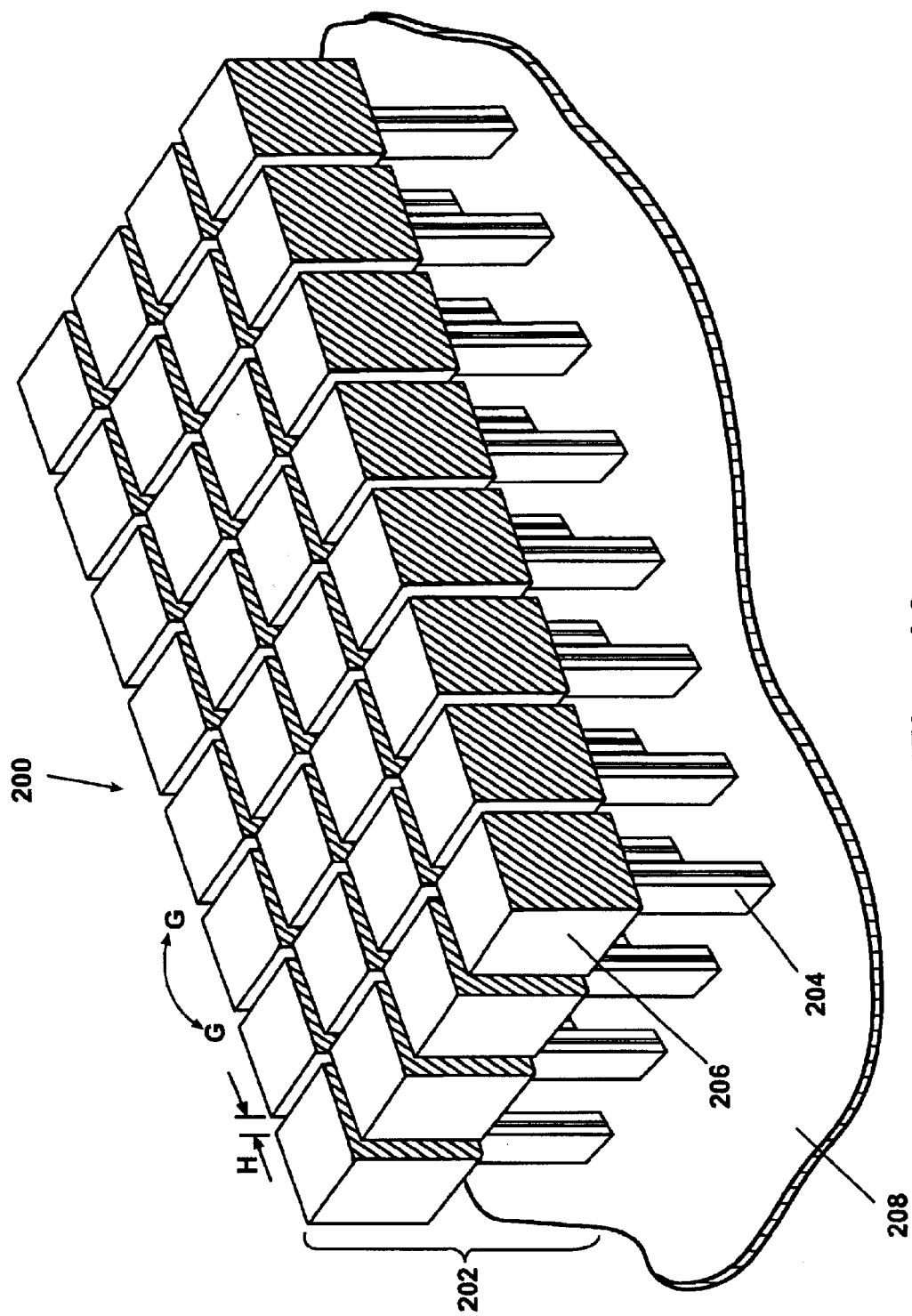
FIG. 13 is a perspective view of an alternate preferred embodiment of the present invention having vertically disposed MEMS members.

Referring now to FIG. 13, another preferred embodiment of the present invention is shown. FIG. 13 shows a portion of a vertical element unit cell 200. Each vertical element 202 of the vertical element unit cell 200 is comprised of a vertical bimorph beam 204 and a unitary mass 206. For the vertical element unit cell 200, a single sheath 208 having conductive traces is used. The single sheath 208 is attached to the vibrating body inducing each of the vertical bimorph beams 204 to vibrate. Bi-directional motion indicated by arrows G is provided for each of the unitary masses 206. Each unitary mass 206 therefore forms the deflection limit for each successive vertical element 202. Vertical mass to vertical mass spacing identified as arrows H ranges from several micrometers to about 200 micrometers. The fixed end of each vertical bimorph beam 204 is electrically joined to the conductive traces of the single sheath 208 by construction as will be further elucidated with reference to FIGS. 14 to 19.

The process for forming the vertical element unit cell 200 differs from the process used to form the horizontal unit cell 100 of FIG. 12. The following steps are used to form the vertical element unit cell 200.

Figure 14:
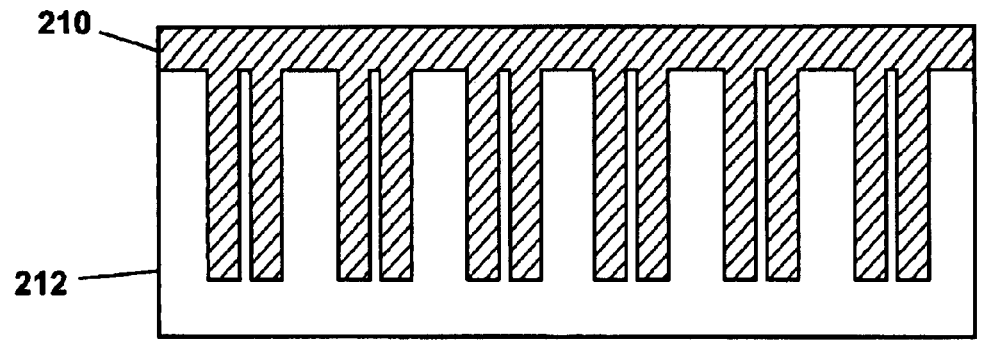
FIG. 14 is an elevation view of a mold insert having an embossed or injected plastic sacrificial replica mold thereon.

Referring to FIG. 14, the initial construction stage of a vertical element unit cell is shown. A permanent mold insert 210, preferably constructed of nickel, is used as the receiving mold to develop a plastic sacrificial replica mold 212 having individual vertical beams. Alternate materials can also be used for the permanent mold insert 210. Either an embossing or an injection molding technique is used to prepare the plastic sacrificial replica mold 212 using the permanent mold insert 210. The material for the plastic sacrificial replica mold 212 is preferably polymethylmethacrylate (PMMA) due to the material's photo-imaging properties using an electron beam, X-rays, or ultraviolet light. Other materials can be used for the plastic sacrificial replica mold 212.

Figure 15:
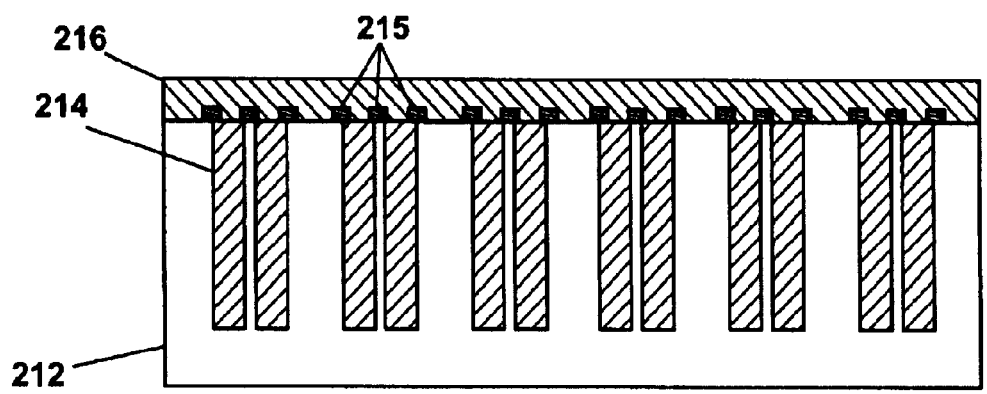
FIG. 15 is an elevation view of the plastic sacrificial replica mold of FIG. 14, showing the mold cavities filled with a ceramic piezoelectric slurry to form piezoceramic beams, and a separate ceramic body attached to exposed surfaces of the piezoceramic beams with conductive traces present at the base of the beams.

Referring now to FIG. 15, the plastic sacrificial replica mold 212 is shown following removal from the permanent mold insert 210. A slurry of piezoceramic material 214 is poured into each of the cavities of the plastic sacrificial replica mold 212. The top surfaces of each of the filled cavities of the plastic sacrificial replica mold 212 are polished after the piezoceramic material 214 solidifies. A plurality of metal conductive layers 215 is then deposited through a mask (not shown) to the polished surfaces of the piezoceramic material 214. Since the deposition of a metal conductive layer is known in the art, it is not detailed herein. The material for the metal conductive layer is preferably a gold or gold containing material deposited using an evaporative or a sputtering step also known in the art. A wafer 216 of ceramic or alternately of quartz material is then attached using a thin layer of a high temperature adhesive (not shown) to the polished surfaces of the plastic sacrificial replica mold 212 and the piezoceramic material 214. The piezoceramic material 214 does not adhere to the material of the plastic sacrificial replica mold 212.

Figure 16:
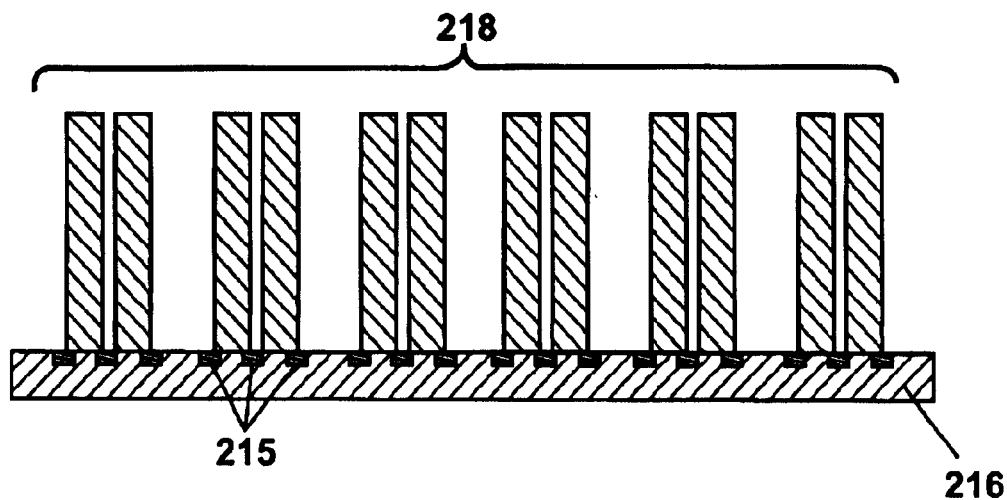
FIG. 16 is the rotated elevation view of FIG. 15 after removal of the plastic molded material by a heat/curing process, showing a plurality of vertical piezoceramic beams.

Referring to FIG. 16, following the addition of the wafer 216, as shown in FIG. 15, the sub-assembly is heat cured which removes the plastic material, i.e., the plastic sacrificial replica mold 212 shown in FIG. 15. The remaining material following this heat curing process is the arrangement shown in FIG. 16 having the wafer 216 rotated 180° from the orientation shown in FIG. 15, thus showing the vertical piezoceramic beams 218 in an upward facing direction as viewed in FIG. 16.

Figure 17:
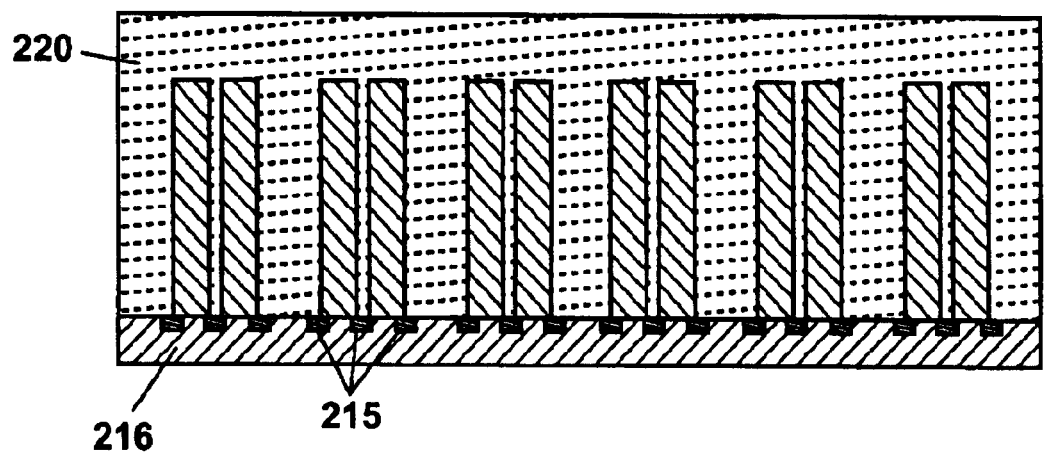
FIG. 17 is the elevation view of FIG. 16, further showing a photo-imageable layer molded over the vertical beams of FIG. 16.

Referring now to FIG. 17, a photo-imageable layer 220 is applied over the vertical piezoceramic beams 218. This photo-imageable layer 220 surrounds each of the vertical piezoceramic beams 218 and contacts the piezoceramic wafer 216. The photo-imageable layer 220 can advantageously be applied up to a thickness of about 1 to 2 millimeters. Material for the photo-imageable layer 220 is preferably a PMMA material.

Figure 18:
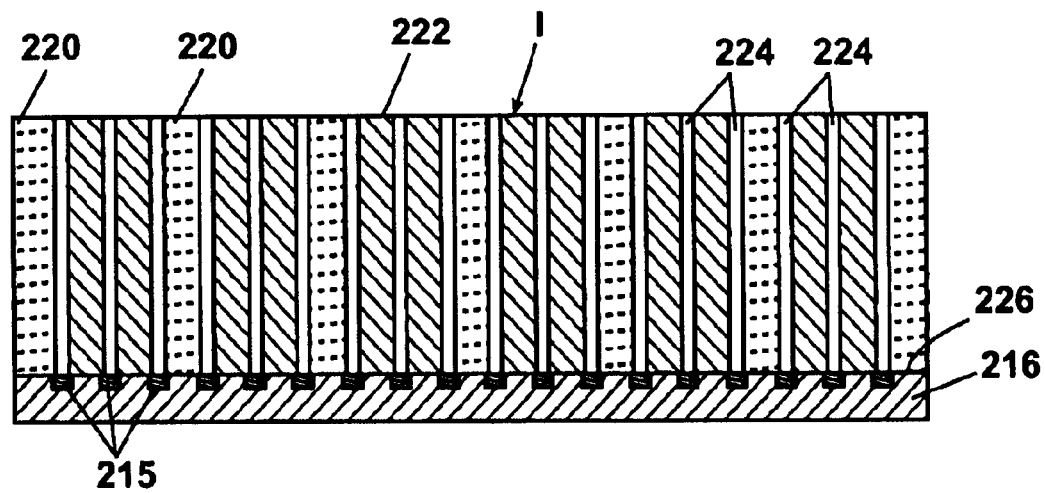
FIG. 18 is the elevation view of FIG. 17 showing a plurality of recesses formed after an aligned x-ray exposure photolithographic process with a plurality of electrical contacts at the base of the beams used for metal plating.

Referring to FIG. 18, the remaining photo-imageable layer 220 from FIG. 17 is shown after the top surfaces of each of the vertical piezoceramic beams 218 has been planarized to remove the excess photo-imageable layer 220 material. The excess material is removed to form a surface 222 indicated by arrow I. During this step, an aligned x-ray exposure is also performed to create a plurality of exposure recesses 224 down to a wafer surface 226 of the wafer 216 (installed in the step shown in FIG. 15).

Figure 19:
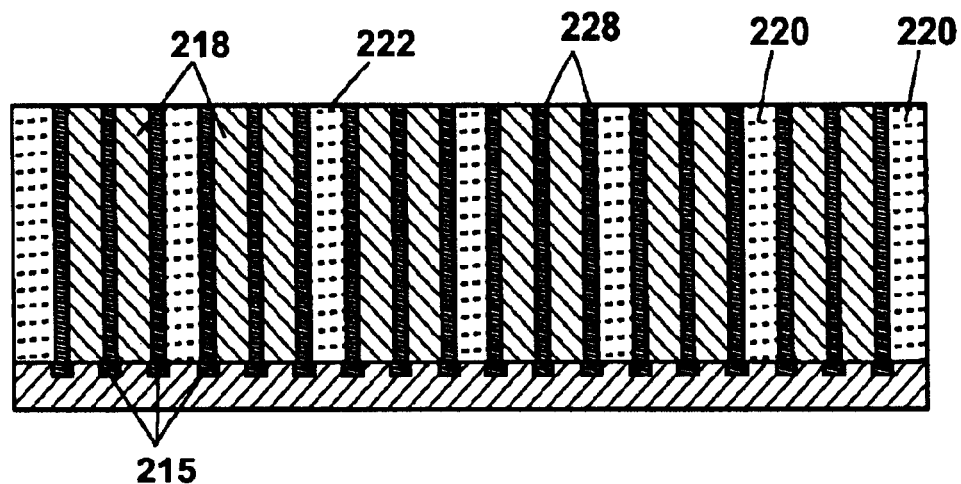
FIG. 19 is the elevation view of FIG. 18, further showing a metal filler material plated within the recesses evacuated by the photolithographic step shown in FIG. 18.

Referring to FIG. 19, the exposure recesses 224 of FIG. 18 are filled with an electrically conductive plating material 228 from each of the electrical contacts 215 up to the surface 222 of each of the vertical piezoceramic beams 218. Material for the electrically conductive plating material 228 is selected from materials including nickel, copper, gold, and other electrically conductive materials. This is followed by a flood exposure step for the later removal of the resist pattern used for plating.

Figure 20:
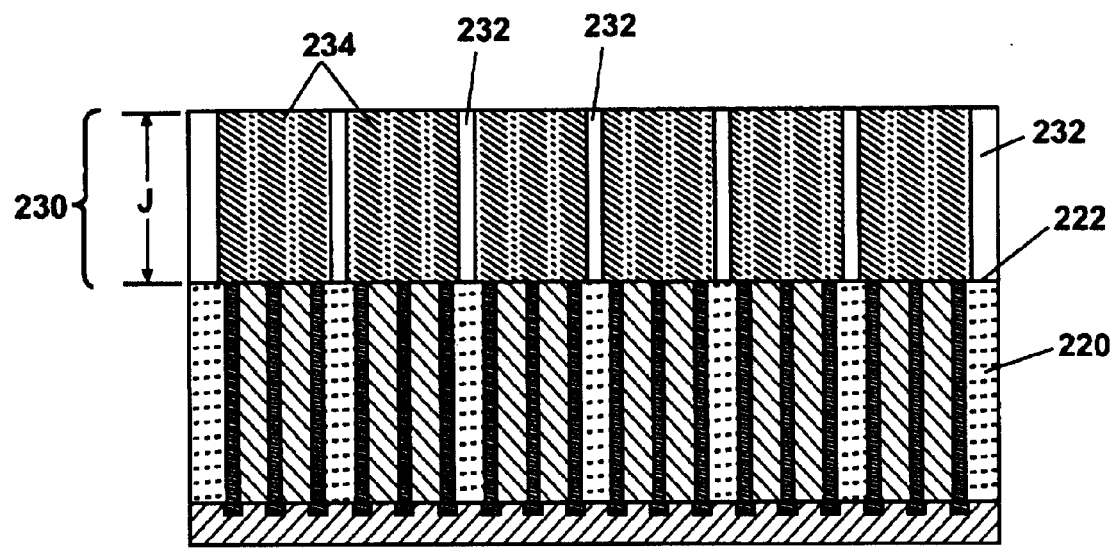
FIG. 20 is the elevation view of FIG. 19, further showing a spin coated, metal-filled x-ray resist on top of the substrate which forms the cantilevered mass.

Referring to FIG. 20, a metal filled, negative x-ray resist 230 is spin coated on the surface 222 to a predetermined height J. The predetermined height J is determined by at least one of the following: 1) the natural frequency modes of the vibrating body to which the vertical element unit cell or array is attached; 2) the number of elements of the vertical element unit cell; 3) the amount of electrical current desired; 4) the material/density of the mass elements; 5) the type of piezoelectric material used; and 6) the length of the piezoceramic cantilevered beams. Preferably, a plastic material is used for the negative x-ray resist 230. The plastic material should be a solvent-free plastic, such as epoxy, such that contact with the negative x-ray resist 230 will not effect the PMMA material of the photo imageable layer 220 remaining in the structure during this step. A photo-lithographic step is then performed to remove material from the negative x-ray resist 230, leaving open areas 232 to form a plurality of vertical unitary masses 234. Material for the vertical unitary masses 234 can be of metal, high density plastic, ceramic, or other material having a density suitable as a weighted mass.

Figure 21:
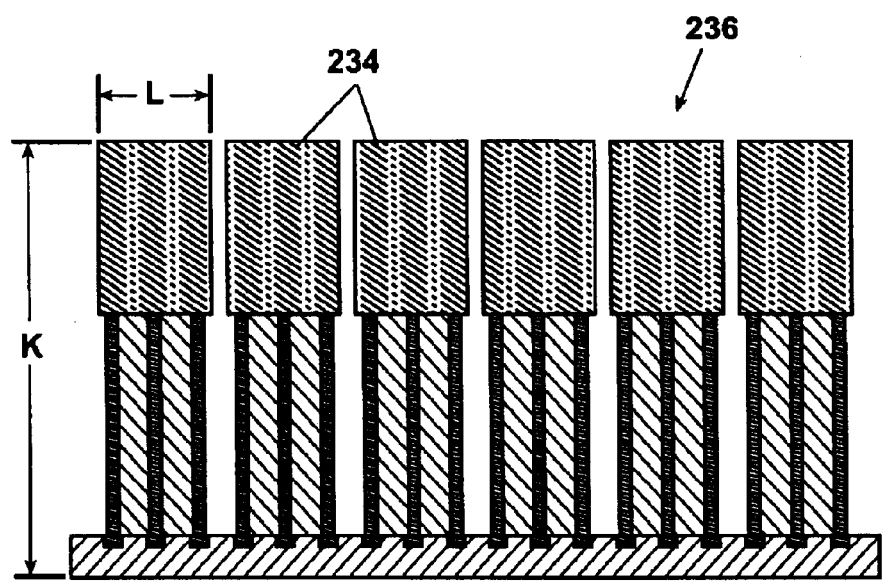
FIG. 21 is an elevation view showing a portion of a unit cell of vertical elements of the present invention, following etching to remove all plastic material.

Referring now to FIG. 21, the remaining the PMMA material of the photo-imageable layer 220 shown in FIG. 20 is developed and stripped to form the final pattern of a partial unit cell 236 shown. A total vertical element height K ranges from about 0.1 mm to about 2.0 mm. The vertical element mass width L ranges from about 0.1 mm to about 2.0 mm. To avoid electrical shorting between sections of the piezoceramic beam(s) if an electrically conductive material is used for the vertical unitary masses 234, an insulating layer (not shown) of a non-electrically conductive material is deposited between each vertical unitary mass 234 and each vertical piezoceramic beam 218.

For applications using the vertical element design of the present invention, a protective cover can be used to prevent foreign material from entering between individual elements and to prevent physical damage to the exposed elements. The advantage of the vertical element design is that a greater number of elements per square unit area is obtainable, therefore a potentially greater electrical current can be generated.

Currently, MEMS devices are generally constructed of micro-machined silicon. For the present invention, a refractory metal such as tungsten, molybdenum, tantalum, or titanium is preferably used for construction of the element bodies. These materials provide better stiffness and much higher densities and thus are more suitable as proof mass material.

The piezoelectric MEMS devices of the present invention can be used as an electrical current source and attached to vibration sources which vary significantly. Examples of such vibration sources are any moving vehicle, i.e., automobiles, aircraft, military craft and spacecraft. The devices of the present invention can also be used on a wide variety of other applications, such as being attached to clothing for generation of a small electrical power for hand-held electrical devices such as telephones. Another useful adaptation for the devices of the present invention is as a power source for remote sensing equipment. Known sensing equipment used for remote sensing devices typically use batteries or other electrical power generation sources such as chemical reactions. The piezoelectric devices of the present invention can be used to replace the battery or other power sources for remote sensor applications.

The bimorph configuration of the piezoelectric materials of the present invention is a preferred embodiment of the present invention. Poling of the piezoelectric material is preferably conducted prior to joining the two layers of material together to form the bimorph due to the elevated temperature of the poling process. The material is poled perpendicular to its thickness. The resulting piezoelectric material has a metallic contact plated on either side of the material to collect the electrical current.

The piezoelectric devices of the present invention offer several advantages. By configuring the devices into unit cells of varying numbers of elements, and with the ability to employ multiple unit cells in an array, a wide variety of electrical currents for varying power sources can be derived. The piezoelectric devices of the present invention are capable of being employed on flat or on varying geometry surfaces. These devices are relatively unaffected within a temperature range of about −60° centigrade to about 200° centigrade. The piezoelectric devices of the present invention also can operate essentially maintenance free for a significant period of time, i.e., several decades. There is no fuel source and there are no moving parts other than the degree of motion required for the cantilevered beams. The devices are pre-tuned based on the natural frequency modes of the item to which they are attached, such that spacing between each weighted mass of the elements of the device can be predetermined to preclude damaging the piezoelectric materials by over-extension. The piezoelectric devices of the present invention will generate electrical current in the milliwatt range compared to devices known in the art which produce current in the microwatt or nanowatt ranges.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A bimorph piezoelectric device comprising:

a plurality of micro-electro-mechanical-system (MEMS) piezoelectric beams, said plurality of MEMS beams arranged as pairs of MEMS beams, each pair having a connecting end and a weighted end;

each of said pairs of MEMS beams being electrically and mechanically joined through its connecting end to at least one flexible sheath having a plurality of electrically conductive traces to form a joined array of MEMS beams each having its weighted end free to deflect; and each weighted end of said pairs of MEMS beams of said joined array being deflectable to produce an electric current proportional to a quantity of said pairs of MEMS beams, said electric current collectable from each of said at least one flexible sheath.

2. The device of claim 1, wherein each of said plurality of MEMS piezoelectric beams comprises a layer of piezoelectric material sandwiched between adjoining layers of electrically conductive material.

3. The device of claim 1 wherein each pair of MEMS beams is formed by joining an inner adjoining electrically conductive layer of one beam of each beam pair to an inner adjoining electrically conductive layer of an alternate beam of each beam pair.

4. The device of claim 3, wherein each said weighted end has a weighted mass attached to each of an opposed pair of outer layers of electrically conductive material of each beam pair.

5. The device of claim 4, further comprising:

said at least one flexible sheath being an upper sheath and a lower sheath;

an upper intermediate beam connecting a first of said opposed pairs of outer layers of electrically conductive material to said upper sheath;

a lower intermediate beam connecting a second of said opposed pairs of outer layers of electrically conductive material to said lower sheath.

6. The device of claim 5, wherein both said upper intermediate beam and said lower intermediate beam are joined to each said flexible sheath by an electrically conductive adhesive.

7. The device of claim 5, wherein each said flexible sheath provides a deflection limit for each adjacent weighted mass to prevent fracture of said piezoelectric material of each pair of MEMS beams by over-deflection of said piezoelectric material.

8. The device of claim 7 wherein each said flexible sheath further comprises a plurality of perforations providing for flow of an etching solution.

9. The device of claim 3 further wherein each pair of MEMS beams is connected at its connecting end to a single flexible sheath forming a vertical array of MEMS beams.

10. The device of claim 9 wherein said weighted end of both MEMS beams forming each pair of MEMS beams form a pair of weighted ends having a single mass attached thereto.

11. A piezoelectric device for converting vibration energy to electric current comprising:

a plurality of pairs of oppositely polarized micro-electro-mechanical-system piezoelectric layers deflectable to produce an electrical current;

said plurality of pairs of layers each connected to a set of micro-electro-mechanical-system elements;

each said set of elements with said pairs of layers forming a bimorph, said bimorph configured as a cantilevered beam;

each said cantilevered beam being mass weighted on a first beam end and fixedly attached to at least one flexible sheath on a second beam end; and a plurality of said bimorphs on said at least one flexible sheath forming an array.

12. The device of claim 11, further comprising:

each said flexible sheath having a bimorph attachment side and a vibration body attachment side; and said bimorph attachment side collects said electrical current from each bimorph attached thereto for one of extraction, storage, and distribution of said electrical current.

13. The device of claim 12, wherein said vibration body attachment side is rigidly fixed to a vibration source to produce an oscillating deflection of each bimorph to generate said electrical current.

14. The device of claim 13, wherein a quantity of said bimorphs within said array varies in direct proportion to a value of said electrical current.

15. The device of claim 11, wherein said set of micro-electro-mechanical-system elements is selected from the group consisting of tungsten, molybdenum, tantalum, and titanium.

16. The device of claim 11, further comprising:

said array forms a first layer of a multilayer piezoelectric power generator; and each layer of said power generator is a copy of said array.

* * * * *